United States Patent
Loeffelbein et al.

(10) Patent No.: US 10,505,129 B2
(45) Date of Patent: Dec. 10, 2019

(54) METHOD OF PRODUCTION OF HIGH-REFRACTIVE THIN GLASS SUBSTRATES

(71) Applicant: SCHOTT AG, Mainz (DE)

(72) Inventors: Bernd Loeffelbein, Saulheim (DE); Frank Buellesfeld, Kriftel (DE); Andreas Langsdorf, Ingelheim (DE)

(73) Assignee: SCHOTT AG, Mainz (DE)

( * ) Notice: Subject to any disclaimer, the term of this patent is extended or adjusted under 35 U.S.C. 154(b) by 0 days.

(21) Appl. No.: 15/498,813

(22) Filed: Apr. 27, 2017

(65) Prior Publication Data

US 2017/0338428 A1 Nov. 23, 2017

(30) Foreign Application Priority Data

Apr. 28, 2016 (DE) .......................... 10 2016 107 934

(51) Int. Cl.
| | |
|---|---|
| *H01L 51/00* | (2006.01) |
| *C03C 3/064* | (2006.01) |
| *C03C 3/078* | (2006.01) |
| *C03C 3/087* | (2006.01) |
| *H01L 51/52* | (2006.01) |
| *C03B 23/037* | (2006.01) |
| *C03B 23/047* | (2006.01) |

(52) U.S. Cl.
CPC ........ *H01L 51/0096* (2013.01); *C03B 23/037* (2013.01); *C03B 23/047* (2013.01); *C03C 3/064* (2013.01); *C03C 3/078* (2013.01); *C03C 3/087* (2013.01); *H01L 51/5275* (2013.01)

(58) Field of Classification Search
None
See application file for complete search history.

(56) References Cited

U.S. PATENT DOCUMENTS

| 3,635,687 | A | | 1/1972 | Dunlap | |
|---|---|---|---|---|---|
| 4,149,895 | A | * | 4/1979 | Boudot | ..................... C03C 4/20 |
| | | | | | 501/63 |

(Continued)

FOREIGN PATENT DOCUMENTS

| DE | 3884715 | 4/1994 |
|---|---|---|
| DE | 102014100750 | 10/2014 |

(Continued)

*Primary Examiner* — David Sample
(74) *Attorney, Agent, or Firm* — Ohlandt, Greeley, Ruggiero & Perle, L.L.P.

(57) ABSTRACT

A redrawing method for the production of thin glasses is provided that allows redraw of high refractive index optical glasses. The includes the steps of providing a vitreous preform with a mean width B, a mean thickness D, and a refractive index $n_D$ of at least 1.68 in a redrawing device, heating at least a part of the preform, redrawing of the preform to a thin glass with a mean width b and a mean thickness d. The heated part of the preform exhibits, for the duration of at most 30 minutes, a temperature above a lower limit of devitrification of the glass. The glass of the preform exhibits a dependence of the viscosity on the temperature, which is characterized by a mean decrease of the viscosity with increasing temperature in an viscosity range of $10^8$ to $10^5$ dPas of at least $3*10^5$ dPas/K.

21 Claims, 7 Drawing Sheets

(56) References Cited

U.S. PATENT DOCUMENTS

| | | | |
|---|---|---|---|
| 4,439,528 A * | 3/1984 | Araujo | C03C 3/078 501/32 |
| 4,839,314 A | 6/1989 | Boudot | |
| 5,525,554 A * | 6/1996 | Comte | C03C 3/062 501/63 |
| 7,615,507 B2 | 11/2009 | Endo | |
| 2005/0272589 A1 | 12/2005 | Shimizu | |
| 2011/0143907 A1 * | 6/2011 | Fujiwara | C03C 3/068 501/42 |
| 2013/0011607 A1 | 1/2013 | Mushiake | |
| 2013/0230692 A1 | 9/2013 | Yanase | |
| 2013/0231237 A1 | 9/2013 | Kayaba | |
| 2013/0319051 A1 * | 12/2013 | Bisson | C03B 18/04 65/99.2 |
| 2014/0284577 A1 | 9/2014 | Mennemann et al. | |
| 2014/0342120 A1 | 11/2014 | Buellesfeld | |
| 2015/0315066 A1 * | 11/2015 | Wolff | C03C 3/097 257/40 |
| 2017/0283305 A1 * | 10/2017 | Brocheton | C03C 3/062 |

FOREIGN PATENT DOCUMENTS

| | | |
|---|---|---|
| EP | 0408873 | 1/1991 |
| GB | 2000492 | 1/1979 |
| JP | S5416524 | 2/1979 |
| JP | 8-73239 A | 3/1996 |
| JP | 9-86944 A | 3/1997 |
| JP | 2005-47732 | 2/2005 |
| JP | 2007-22846 A | 2/2007 |
| JP | 2010-180129 A | 8/2010 |
| JP | 2012-121755 | 6/2012 |
| JP | 2012-121756 | 6/2012 |
| JP | 2013-63892 A | 4/2013 |
| JP | 2013-180919 A | 9/2013 |
| JP | 2014-196238 | 10/2014 |
| JP | 2014218427 | 11/2014 |
| JP | 2015160805 | 9/2015 |
| JP | 2015187070 | 10/2015 |
| JP | 2015-227276 | 12/2015 |
| WO | 2016008866 | 1/2016 |
| WO | 2016008867 | 1/2016 |

\* cited by examiner

METHOD OF PRODUCTION OF HIGH-REFRACTIVE THIN GLASS SUBSTRATES

CROSS REFERENCE TO RELATED APPLICATIONS

This application claims the benefit under 35 U.S.C. 119 of German Application No. 10 2016 107 934.0 filed on Apr. 28, 2016, the entire contents of which are incorporated by reference.

BACKGROUND

1. Field of the Invention

This invention relates to a method of the production of a high-refractive thin glass by means of redrawing as well as a high-refractive thin glass that is obtainable with this method.

2. Description of Related Art

Some methods of production of high-refractive glass substrates are known from the prior art. So US 2013/0011607 A1 mentions glasses with refractive indices from 1.55 to 2.3. These glasses should be suited for processing in a Down Draw- or Floating process, in particular in the Overflow Down Draw-process, since they were optimized for this process with regard to their composition. Also redrawing is mentioned as a possible method of treatment without revealing details, how these glasses could be treated in the redrawing process. These glasses are optimized for the floating- and Down Draw process by means of substantial proportions of strontium oxide. The refractive index effectively obtained in the glasses of US 2013/0011607 A1 is in the order of 1.61 to 1.66. The goal to provide glasses with a refractive index of up to 2.3 as thin glasses is missed in the document apparently. The same holds accordingly for US 2013/0230692 A1.

Also WO 2016/008866 A1 and WO 2016/008867 A1 teach thin glasses with high-refractive index and deal with the difficulties of the treatment of glasses with high-refractive index in flat-glass processes. As flat-glass processes the so-called in line-processes Down Draw and Overflow Fusion are preferred. But also the redrawing method is mentioned. This is described as a method, in which there is an especially high danger of crystallization. With other words the method is described as especially critical for high-refractive optical glasses. The reason is, that in the redrawing a preform is used, which has already passed the crystal growth area once, i.e. the glass was already cooled down from the melting, so that a temperature range was passed through, in which the glass can crystallize. This temperature range depends on the respective glass. Therefore crystal nuclei can be present in the glass already, which in the following lead fast to a devitrification at the redrawing. The documents mentioned propose as a solution to produce optical glasses with an especially long viscosity profile, thus with only a gently pronounced dependence of the viscosity on temperature. As frequently in the state of the art, also in these two documents an optimization of the composition of the glass is aimed for, to be able to treat this in flat glass processes.

Generally a problem exists in glasses with high refractive index, that by use of glass components with a high refractive index (for example $TiO_2$, $ZrO_2$, $Nb_2O_5$, BaO, CaO, SrO, ZnO, $La_2O_3$) also the crystallization tendency increases. One exception is PbO, which for ecological reasons should not be used. Crystallization tendency means in this case, that in certain temperature ranges during the production process the glass produces easier crystals and thus devitrifies easier than other glasses, which do not exhibit a pronounced crystallization tendency. It is common to the methods of the production of thin glass substrates, that a glass melt or a glass product has to be held for a relatively long duration of time at a raised temperature, to make the forming operation possible. Thereby the danger of devitrification increases. This is also the reason, why glasses with high refractive index were generally not produced in flat glass processes in the prior art. In order to nevertheless obtain thin glasses with high refractive index, these glasses were melt in a classical process, poured in forms of bars and cooled down fast, for example by pressing or rolling with cooled forms. By fast cooling the glass melt passes through the range of temperature, in which the crystallization can occur, that fast that no crystals can form. The bars obtained in this way subsequently were converted by sawing and polishing into thin glass substrates, which is very inefficient.

DE 10 2014 100 750 A1 describes a redrawing method for the production of thin glass components. In this a preform in particular is heated to temperatures, which correspond to viscosities from $10^{5.8}$ dPas to $<10^{7.6}$ dPas. There also optical glasses are redrawn. These optical glasses belong to phosphate- and fluorophosphate glasses, which exhibit refractive indices $n_D$ in the range from 1.53 (for example Schott N-PK51) or even only 1.49 (for example Schott N-FK51A).

SUMMARY

These prior art glasses are with regard to their properties not comparable with high refractive glasses, which are applied in the present invention.

It is obvious that the method of redrawing is especially critical for glasses with high refractive index. Eventually in the redrawing process a preform is used, which has already passed once the range of temperature, in which the crystallization is possible. If during the cooling crystal nuclei already had formed, so these would lead rapidly to crystallization in the redrawing process.

In the state of the art a method is missing, that is suited, to treat also those glasses with high refractive index, which were with regard to their composition not optimized for these processes, in a flat glass process to thin glasses. The method should not only be suited to provide high refractive thin glasses but also to reach a high yield. Preferably in the method problems should be solved also, which arise out of the higher density and higher coefficient of thermal expansion, which frequently occur in glasses with high refractive index. In particular the method should make available thin glasses, which with regard to surface quality, tensions and inner quality comply with the commonly high requirements of optical glasses.

In practice, optical glasses are chosen for a distinct use with regard to their optical properties. There, normally not only the refractive index, but also the dispersion and many other properties of the glasses play a role. In the rarest cases it will be possible to optimize a composition of a glass with respect to the producibility as a thin glass, without not also changing one or more desired properties of the glass. Generally the desired specifications are fixed by the customer requested application area. Thus, the producer of glasses cannot adapt the composition of glasses at will, since he would change with this also the desired properties. Glasses are system from a manifold of components, wherein a change of the relative quantity of one component can have unpredictable consequences to a manifold of properties of the glass.

It would be desirable to have a method at hand, with which optical glasses become available as thin glasses without the necessity of an optimization of the composition of the glass.

The present invention provides a method, with which glasses with high refractive index can be processed to thin glasses. The method of the present invention is to be attributed to the redrawing methods. Generally redrawing methods are known from the state of the art, for example from U.S. Pat. No. 3,635,687 A.

In the redrawing process a piece of glass (called "preform") is heated partially and is lengthened with suited mechanical utilities. If the preform is driven into a heating zone with a constant velocity and the heated glass is drawn with a constant velocity, a reduction of the cross section form of the preform dependent on the proportion of the velocities is obtained.

Thus, if for instant bar- or pipe-shaped preforms are inserted, bar- or pipe-shaped glass components are produced again, however, with smaller cross section. In similar way, also plate-shaped preforms can be redrawn. The according to the invention producible thin glasses can in their cross section form be similar to the preform, so that they represent with respect to their cross section form a 1:1 diminished copy of the preform. But they can be also deformed in such a way, that from plate-shaped preforms a strip-shaped thin glass with reduced thickness is produced.

In the redrawing process of glasses generally a longish preform is mounted to one side in a holding and heated for example in a muffle furnace on the other end. As soon as the glass becomes formable it is drawn by applying a drawing force to the end of the preform mounted in the holding. If the preform is further fed into the muffle, at a suited choice of temperature a thin glass component results that has a smaller cross section but is geometrically similar.

From a disk-shaped preform equally an almost strip-shaped thin glass component can be produced by the redrawing process, which exhibits a significantly smaller thickness than the preform. The choice of velocities of the drawing of the thin glass component and of the feeding of the preform determines the factor of deformation or of decrease in size of the cross section, respectively.

The method of the invention is a method for the production of a high refractive thin glass, which comprises the following steps: Provision of a vitreous preform with a mean width B and a mean thickness D and a refractive index $n_D$ of at least 1.68 in a redrawing device, heating of at least a part of the preform, redrawing of the preform to a thin glass with a mean width b and a mean thickness d, wherein the heated part of the preform exhibits for the duration of at most 30 min a temperature above the lower limit of devitrification (herein termed "UEG" based on the German term "Untere Entglasungsgrenze") of the glass, and wherein the glass of the preform exhibits a dependence of the viscosity on the temperature, which is characterized by a mean decrease of the viscosity with increasing temperature in an viscosity range of $10^8$ to $10^5$ dPas of at least $3*10^5$ dPas/K.

The temperature above the lower devitrification limit of the glass is preferably close to the lower devitrification limit. In particular the temperature is lower than the melting temperature ($T_m$) of the glass, preferably lower than UEG+ $0.7*(T_m s-UEG)$, more preferably lower than UEG+0.4* $(T_m-UEG)$ and in particular preferably lower than UEG+ $0.2*(T_m-UEG)$. A special advantage of the method of the invention is, that glasses with high refractive index are to a large extend processable in the method of the invention without considering their remaining properties. Thus, in particular the composition of the glass does not have to be adapted with respect to the crystallization tendency. Rather the method is adapted to the properties of a high refractive glass by that, that the heated part of the preform exhibits during the process for not longer than 30 min a temperature above the lower devitrification limit of the glass and the glass with a suitable minimum dependence of the viscosity on the temperature in the denoted temperature range is chosen. The heated part of the preform exhibits during the process preferably for at least 2 s in particular at least 10 s a temperature above the lower devitrification limit of the glass.

Preferably the heated part of the preform will exhibit during the process for not longer than 15 min, further preferably for not longer than 6 min, more preferably not longer than 4 min, in particular preferably not longer than 2 min temperatures above the lower devitrification limit of the glass. It became apparent, that with an execution of the process in such a way the crystallization of the glass can be kept in a measure acceptable for common optical uses. It is foreseen in the process according to the invention, that the heated part of the preform exhibits for a duration of at least 2 s, preferably at least 10 s, in particular at least 30 s and preferably at least 1 min temperatures above the lower limit of devitrification of the respective glass. Due to the utilization of temperatures above the lower limit of devitrification of the glass of the preform a certain crystallization occurs. This crystallization, however, is acceptable for optical uses, if the heated part of the preform is not kept too long at temperatures above the lower limit of devitrification and the glass of the preform exhibits the denoted minimum degree of dependence of the viscosity on the temperature in the relevant range of temperatures.

The glass of the preform exhibits in the process according to the invention in particular a dependence of the viscosity on the temperature, which is characterized by a mean decrease of the viscosity with increasing temperature in a range of viscosity from $10^8$ to $10^5$ dPas of at least $3*10^5$ dPas/K, in particular of at least $5*10^5$ dPas/K, preferably at least $8*10^5$ dPas/K or at least $9*10^5$ dPas/K. With this provision it is accomplished, that the viscosity of the glass increases in the relevant range of temperature already with a small decrease of the temperature in such a severe manner, that the viscosity range critical for the crystallization is rapidly left again and further crystallization is prevented.

From practical considerations the glass of the preform preferably should be chosen that way, that the mean decrease of the viscosity with increasing temperature in a range of viscosity from $10^8$ to $10^5$ dPas is on average at most $5*10^6$ dPas/K, in particular at most $2*10^6$ dPas/K, preferably at most $1.5*10^6$ dPas/K, in particular preferably at most $1.2*10^6$ dPas/K. This upper limit originates from practical considerations. So it is with a glass, that reacts extremely on variations of the temperature, extraordinary difficult, to keep the viscosity of the glass in the range desired.

Thus, due to the method disclosed herein a multitude of possibilities are available to the skilled person, to choose preforms of optical glass with the desired properties for the process, without the need, that a glass has to be developed for that process. The choice of a glass with suited properties with respect to the dependence of the viscosity on the temperature implicates the advantage, that the viscosity can be influenced particularly fast—i.e. with small changes of the temperature. Besides the possibility, to leave again rapidly the temperature range critical for the crystallization and thus to shorten the time, for which the glass is kept at temperatures above the lower devitrification limit, hence, this property is also important, since glasses with high refractive index normally also exhibit a high heat capacity. Thus with the choice of the glasses described here a possibility was created, to process optical glasses in known redrawing devices; however, in particular well suited are devices, which make it possible, to set up a deformation zone with a small height. In the case of glasses with very "long" viscosity-temperature-profile in the relevant range of temperature a significant effort of cooling had to be pursued, to dissipate the heat fast enough. The consequence would be a too long stay of the preform at temperatures dangerous for the crystallization and a respective crystallization.

With the method according to the invention preforms from high refractive glasses can be redrawn in surprisingly easy manner, so that very cost-effectively thin, respectively, thin-walled glass products can be produced with particularly high surface quality, particularly preferably with at least partially a fire-polished surface quality. The method according to the invention can be utilized for known optical glasses. The glasses exhibit refraction indices $n_D$ of more than 1.68, in particular more than 1.7, more preferably 1.75, particularly preferably 1.79.

The lower devitrification limit is for every glass at another temperature und viscosity. It is determined in the following way. A sample of at most 300 mm length, 10 mm width and 5 mm height (for example 10 mm×10 mm×5 mm) of the glass to be tested is polished optically from all sides and tempered subsequently at different temperatures ($T_A$, $T_B$, $T_C$, ... $T_n$) for 900 min each. Preferably the temperatures are at most 15 K apart. Therefore the samples are placed on a Pt10Rh-sheet metal and positioned in a gradient furnace. After the tempering is finished, the samples are investigated with a light microscope at a magnification of 40 with a one-sided edge lighting. The lower devitrification limit is the smallest temperature, at which crystals become visible.

The method of the invention comprises a step of heating at least of a part of the preform. This part is heated to a temperature $T_2$, at which the viscosity of the glass is between $10^4$ und $10^8$ dPas. In particular $T_2$ is a temperature, which causes a viscosity, which is smaller as the viscosity of the glass at the softening point (herein termed "EW" based on the German term "Erweichungspunkt"). Preferably the glass of the preform exhibits at the temperature $T_2$ a viscosity $\eta_2$ of less than $10^{7.6}$ dPas, further preferably at most $10^{7.5}$ dPas, even more preferably at most $10^{7.0}$ dPas, particularly preferably at most $10^{6.5}$ dPas. In a preferred embodiment, the deformation zone is heated to a temperature $T_2$, which corresponds to the viscosity of the glass of the preform of at least $10^4$ dPas and at most $10^8$ dPas, in particular $10^{5.8}$ to $10^{7.6}$ dPas, in particular $10^{5.8}$ to $<10^{7.6}$ dPas. The viscosity of a glass depends on the temperature. At any temperature the glass has a certain viscosity. Which temperature $T_2$ is needed, to obtain the desired viscosity $\eta_2$ in the deformation zone, depends on the glass. The viscosity of the glass is determined by DIN ISO 7884-2, -3, -4 and the dependence of the viscosity on the temperature is determined using the VFT-curve (Vogel-Fulcher-Tammann-Equation).

Preferably the temperature $T_2$ is in a temperature range from 650° C. to 800° C. Preferably the temperature $T_2$ is the highest Temperature, which is reached in the glass during the process.

A viscosity $\eta_2$, which is smaller than the viscosity of the respective glass at the softening point, is of advantage, since the drawing force needed for the extension of the preform increases with increasing viscosity. Thus, a smaller viscosity is also connected with a smaller drawing force needed. However, glasses with a high refractive index also have a high density, so that a too small viscosity can lead at the temperature $T_2$ to the fact, that the gravitation impedes the control of the drawing velocity. In other words the viscosity $\eta_2$ of the glass of the preform should not be too low, since in other case a constant extension of the glass is impeded. Therefore the glass of the preform preferably exhibits a viscosity $\eta_2$ at $T_2$ of at least $10^{4.0}$ dPas, more preferably of at least $10^{4.5}$ dPas, still more preferably of at least $10^{5.0}$ dPas, particularly preferably of at least $10^{5.8}$ dPas.

The only short time at high temperatures of the part of the preform heated in step b is influenced by different measures; these are for example the applied drawing force, the viscosity-temperature-profile of the glass, the design of the heating device and the density of the glass. Preferably the short length of stay of the glass at the denoted temperatures is reached amongst others by the fact, that the preform exhibits a small deformation zone. In particular the preform exhibits a deformation zone, which is defined as the part of the preform, which exhibits during the process a thickness between 0.95*D and 1.05*d. Thus, the deformation zone is the part of the preform, in which it deforms due to the heating. The thickness of the preform in the region of the deformation zone is smaller than the original thickness D, the final thickness d of the thin glass, however, is not reached yet. Preferably in the deformation zone a temperature predominates, at which the viscosity of the glass is smaller than $10^{7.6}$ dPas. In particular this temperature is in a range from 650° C. to 800° C. It became apparent, that at smaller temperatures, respectively, larger viscosities, a too strong decrease of the width b in comparison with the original width B takes place. Below a viscosity $10^{7.6}$ dPas it is of advantage, that the width b is reduced only a little compared to the original width B. Thereby relatively large surfaces can be produced as thin glasses.

The preform utilized in this process exhibits preferably a width B of at least 200 mm. In preferred embodiments, the width is at least 300 mm, more preferably at least 400 mm, more preferably at least 500 mm or even at least 700 mm. If a preform with comparatively large width B is utilized, also especially large thin glasses are available. The method is characterized by the fact, that a strong reduction of the original thickness D is possible. In particular it is preferred, that the thickness D of the preform is at least 5 mm, more preferably at least 10 mm, more preferably at least 25 mm. This has the advantage, that the provision of the preform from a glass with a high refractive index is comparatively easy possible. For example normal bars from high refractive index glass can be utilized. With the method of the invention the thickness D of the preform can be reduced significantly. In particular the thickness d of the thin glass available with the method is less than 2 mm.

So that a high yield and with this an economical process is possible, preferably a preform of a certain length L is used. The bigger the length L of the preform, the more thin glass can be produced in one work step in the redrawing process, before a new preform has to be mounted in the redrawing device. Preferably the length L of the preform is at least 500 mm and more preferably at least 1000 mm.

The preform can be produced in a manner common for optical glasses from a high refractive index glass with a refractive index $n_D$ of at least 1.68. The preform has a thickness D and a width B as well as a width-to-thickness-ratio B/D. By the redrawing a change of the ratio B/D of the preform can happen, in particular an increase of the ratio. Preferably it applies: b/d>>B/D.

In accordance with the invention a preform can be provided, in particular a plate-, bar- or disk-shaped preform, of a high refractive glass body with a mean thickness D and a mean width B. At least one section, in particular the deformation zone of the preform, is heated thereafter. Subsequently the extension of the preform to a mean thickness d and a mean width b happens, by what the cross section form of the thin glass component is determined. Thus, by the redrawing a change of the geometry of the cross section of the preform across the direction of drawing can be reached.

The deformation zone concerns thereby the part of the preform, in which the preform exhibits a thickness between 0.95*D and 1.05*d. The deformation zone preferably exhibits a height of at most 50*D, preferably at most 10*D, particularly preferably at most 6*D (in particular at most 100 mm), particularly preferably at most 5*D (in particular at most 40 mm) and particularly preferably at most 4*D (in particular at most 30 mm). The deformation zone preferably extends over the entire width of the preform. With "height" of the deformation zone its extension in that direction is meant, in which the preform is drawn. Outside of the deformation zone the temperature of the preform preferably is smaller than $T_2$. Thereby the deformation of the preform primarily takes place solely in the region of the deformation zone. Above and below the thickness as well as the width preferably remain constant.

It became apparent, that special measures contribute to avoid the devitrification of glasses with high refractive index. This includes particularly the pre-heating of the preform to a temperature below the lower devitrification limit. This step of the pre-heating of the preform preferably is performed before the step of heating of the preform. Thereby it is achieved, that the temperature, respectively, the temperature distribution is better to control. If in this method a non-pre-heated preform was used, it would be more difficult due to the heat distribution in the preform, to reach the temperature, respectively, viscosity needed for the deformation in the redrawing process in only a very small part of the preform. Rather the heat would then distribute in a larger part of the preform, so that parts of the preform could adopt for a too long time period a temperature above the lower devitrification limit of the glass.

Thus, the preform is preferably pre-heated before heating, in particular to a temperature $T_1$. For this purpose the redrawing device preferably exhibits a pre-heating zone, in which the preform can be heated to a temperature $T_1$. The pre-heating zone is preferably arranged in an upper region of the redrawing device. The temperature $T_1$ corresponds approximately a viscosity $\eta_1$ of $10^{10}$ to $10^{14}$ dPas. Thus, the preform is preferably pre-heated before the heating in step b of the process. Thereby a faster movement through the deformation region is made possible, since the time is shorter, which is needed to reach the temperature $T_2$. Likewise it is avoided by the pre-heating zone that glasses with high coefficient of thermal expansion burst due to a too high temperature gradient. Preferably the temperature in the border areas of the preform is higher during the pre-heating than in the middle of the preform. The middle is the part of the preform, which has the same distance to both the border areas in horizontal direction. Therewith a bursting of the preform is avoided in particular in the critical temperature range from room temperature to $T_G$. The temperature $T_1$ is preferably underneath the lower devitrification limit of the glass of the preform, and preferably above $T_G$. A particular advantage lies in diminishing the length of time, during which the preform is exposed to a temperature, which is above the lower devitrification limit, by means of pre-heating and thus to safely preventing a non-desired devitrification.

The width b of the drawn out thin glass component decreases increasingly with increasing viscosity in the deformation zone. If one increases for example the drawing velocity, to reach a thickness d of the thin glass component of 100 μm, the width b of the thin glass component compared to the width B of the preform would be significantly reduced. To obtain a flat thin glass component with a high ratio b/d, it is hence advantageous, when the glass of the preform exhibits in the deformation zone a viscosity $\eta_2$.

Preferably the preform passes through the deformation zone during a duration of less than 30 min, more preferably of less than 15 min and particularly preferably of less than 6 min. In particular, the length of time of a given part of the preform at a temperature $T_2$ is less than 30 min, more preferably less than 15 min and particularly preferably less than 6 min. This demand results from the need, to expose the glass only for very short durations of time to temperatures, in which crystallization could take place.

A preferred temperature profile is characterized by an increase of the temperature of the glass from $T_1$ to $T_2$ with a mean rate of at least 50 K/min, preferably of at least 80 K/min, more preferably of at least 95 K/min. The temperature increase should happen as fast as possible, to bring the glass of the preform fast to viscosities, at which the glass can be deformed as desired. Particularly for glasses with high coefficient of thermal expansion—thus many high refractive index glasses—the heating, however, has to remain under a certain limit. It has been proven advantageous, to heat the temperature from $T_1$ to $T_2$ not faster than with 500 K/min, preferably not faster than 400 K/min, in particular not faster than 250 K/min and particularly preferably not faster than 150 K/min.

The increase of the ratio of the width to the thickness of the preform is preferably primarily achieved by the thickness d of the produced thin glass component being substantially smaller than the thickness D of the preform. The thickness d is preferably at most D/10, more preferably at most D/30 and particularly preferably at most D/75. The thin glass component exhibits in this case a thickness d of preferably less than 10 mm, more preferably of less than 1 mm, more preferably of less than 100 μm, more preferably of less than 50 μm and particularly preferably of less than 30 μm. With the present invention it is possible, to produce such thin thin glass components in high quality and comparatively large area.

The width b of the produced thin glass component preferably is with respect to the width B of the preform hardly diminished. This means, that the ratio B/b is preferably at most 2, more preferably at most 1.6 and particularly preferably at most 1.25.

The process can be performed in a redrawing device. For the purpose of heating the preform can be introduced into the redrawing device. The redrawing device preferably exhibits a holding, in which the preform can be mounted with one end. The holding is preferably situated in an upper part the redrawing device. The preform then is mounted with its upper end in the holding.

The redrawing device exhibits at least one heating facility. The heating facility preferably is located in a middle area of the redrawing device. The heating facility can preferably be an electrical resistance heater, a burner arrangement, a radiant heater, a laser with or without a laser scanner or a combination from these. The heating facility preferably is constructed as such, that it can heat the preform, which is situated in the deforming region, in such a way, that the deformation zone of the invention is obtained, and in particular the temperature $T_2$ is reached. The deformation region is a region, which preferably is situated inside of the redrawing device. The heating facility heats the deformation region and/or a part of the preform to such a high temperature, that a preform, which is situated in the deformation region, takes the temperature $T_2$ within its deformation zone. If a heating facility is used, that is suited to heat selectively only a part of the preform, as a laser, the deformation region hardly heats up.

The deformation region preferably exhibits a height, that generates a deformation zone, which exhibits a height of at most 50*D, preferably at most 10*D, particularly preferably at most 6*D (in particular at most 100 mm), particularly preferably at most 5*D (in particular at most 40 mm) and particularly preferably at most 4*D (in particular at most 30 mm). Depending on the way of heating and dimensions of the preform the deformation region can hence be implemented different in length.

The preform, respectively, a part of the preform, which is directly foreseen for deforming, is heated advantageously at first to a temperature underneath the crystallization temperature, thus, a temperature, at which a crystallization starts, and underneath the softening point of the glass. In this way a crystallization can be prevented. Inside of the deformation region the preform is heated to a temperature $T_2$, which is above the softening point and particularly above the lower devitrification limit. At the softening point the viscosity of the glass is $10^{7.6}$ dPas.

Vitally important for the invention is, that the high refractive index glass for a short time span is exposed to a temperature, which is above the lower devitrification limit. Thereby the maximum time span depends on the predominating temperature in the deformation zone as well on the respective glass. Preferably the glass is heated at no point in time in the process to a temperature, which is above the upper devitrification limit.

The heating facility heats the deformation region and/or a part of the preform, which is preferably only that big, that in the preform the deformation zone of the invention is heated to the temperature $T_2$. The parts of the preform, which are situated above and below the deformation zone, preferably exhibit a temperature, which is smaller than $T_2$. This is preferably achieved according to the invention by the heating facility comprising one or more blinds or other cooling devices, which shadow, respectively, cool those parts of the preform, which are outside of the deformation region. Alternatively or in addition a heating facility can be used, which allows a focused or limited heating of the preform in the deformation region, for example a laser or a laser scanner. An additional alternative concerns a heating facility, which has itself only a small height and which is situated close to the deformation zone, so that the heat does not substantially expand into regions outside of the deformation region.

The heating facility can be a radiant heater, whose heating effect is focused, respectively, limited via suited beam guidance and/or boundaries into the deformation region. For example a KIR (=shortwave IR)-heating can be applied, wherein preferably by shadowing a low deformation zone is generated. Also cooled (gaseous-, water- or air-cooled) blinds can be applied. As a further heating facility a laser can be used. For the beam guidance of the laser a laser scanner can be applied.

The device can exhibit a cooling facility, which preferably is situated in a lower region of he redrawing device, in particular directly underneath the deformation region. Thereby the glass is brought preferably directly after the deformation to viscosities>$10^9$ dPas, so that it does not further deform considerably. This cooling happens preferably in such a way, that a change of the viscosity of at least $10^4$ dPas/s, preferably at least $10^6$ dPas/s results. This corresponds preferably, depending on the glass of the preform, about temperatures $T_3$ in a range from 400 to 700° C., in particular from 450 to <650° C.

The method of the invention comprises preferably further the cooling of the glass after the exit from the deformation region. The further cooling of the glass to viscosities>$10^9$ dPas can happen by natural cooling at ambient, respectively, room temperature (for example 10 to 25° C.). The glass, however, can also be cooled actively in a fluid, as for example a gas flow. Particularly preferably the glass is led through a cooling zone following the deformation zone and is cooled there with a moderate cooling rate, so that the residual stresses allow at least a subsequent cross cutting as well as the edge removal without cracks running in.

Preferably the cooling to a temperature $T_3$, at which the glass exhibits a viscosity of more than $10^9$ dPas, is reached via cooling with moderate velocity. This means, that the cooling of the thin glass from the temperature $T_2$ to a temperature $T_3$ preferably occurs with a mean cooling rate, which is at most 1000 K/min or at most 500 K/min, in particular at most 250 K/min. The glasses with high refractive index, which are processed according to the invention, exhibit frequently high coefficients of thermal expansion. This leads at too fast cooling to tensions in the glass. Therefore it is cooled preferably with moderate cooling rates. The slower it is cooled, the longer the redrawing device has to be designed, since the redrawing process goes on during the cooling. Hence, the mean cooling rate should neither be too small. In particular the mean cooling rate is at least 30 K/min, more preferably at least 60 K/min and particularly preferably at least 100 K/min. It became apparent, that in this way the tensions in the thin glass comply with the high demands on optical glasses, without the need to design the cooling section unnecessarily long. In preferred embodiments, the glass is cooled alternatively or in addition with the mentioned cooling rates by a temperature range, that corresponds to a cooling from $10^{12}$ to $10^{13}$ dPas.

The deformation region is preferably positioned in such a way and/or the heating facility is designed in such a way, that the deformation zone occurs in the preform. By heating the deformation zone of the preform the viscosity of the glass decreases at the correspondent position that strongly, that the preform can be drawn.

Hereby the preform becomes significantly longer while keeping approximately its width. Thus, by drawing of the preform the thickness D decreases. Since the preform preferably is mounted with one upper end in a holding, which is situated preferably in an upper region of the redrawing device, the drawing of the preform can be effected already alone by the influence of the gravity, what, however, should be prevented according to the invention, in particular by this, that the viscosity $\eta_2$ is in the preferred range. In a preferred embodiment, the redrawing device can comprise a drawing facility, which preferably exerts a drawing force on a part of the preform underneath the deformation region, in particular at the lower end of the preform.

The drawing facility is preferably positioned in a lower region of the redrawing device. Thereby the drawing facility can be designed in such a way, that it exhibits rolls, which connect to opposite sides of the preform. The preform can be fixed with one lower end detachably on a second holding.

The second holding is in particular part of the drawing facility. On the second holding for example a weight can be fixed, which then draws the preform to an increased length.

Preferably is the applied drawing force smaller than 350 N per 400 mm preform width (B), more preferably smaller than 300 N per 400 mm preform width, still more preferably smaller than 100 N per 400 mm preform width, particularly preferably smaller than 50 N per 400 mm preform width. Preferably is the drawing force larger than 1 N per 400 mm preform width, more preferably larger than 5 N/per 400 mm preform width, still more preferably larger than 10 N per 400 mm preform width, particularly preferably larger than 20 N per 400 mm preform width. It became apparent, that by applying the mentioned drawing force in cooperation with the viscosity of the glass in the deformation zone an advantageous reduction of the thickness of the preform can be achieved while maintaining substantially the width.

In a preferred embodiment, the preform is fed in the direction of the deformation region, so that the process can be operated continuously. For this purpose the redrawing device preferably comprises a feeding facility, which is suited for moving the preform into the deformation region. Thereby the redrawing device can be applied in continuous operation. The feeding facility moves the preform preferably with a velocity $v_1$ into the deformation region, which is smaller than the velocity $v_2$, with which the preform is drawn. Hereby the preform is drawn to an increased length. The ratio of $v_1$ to $v_2$ is in particular $v_1/v_2<1$, preferably at most 0.8, more preferably at most 0.4 and particularly preferably at most 0.1. The difference of these two velocities determines, to what extent the width and thickness of the preform are diminished.

According to the invention is also a thin glass, which in particular is producible with a method according to the invention, with a refractive index $n_D$ of at least 1.68 and a thickness of less than 2 mm, wherein the refractive index is at least by 0.001 smaller than the theoretical refractive index. Particularly preferably, the refractive index of the glass is smaller even by at least 0.004, particularly preferably at least 0.008 as compared to the theoretical refractive index. In alternative embodiments, the refractive index is smaller even by at least 0.05 or by at least 0.1 as compared to the theoretical refractive index.

The theoretical refractive index is determined by determining initially the refractive index of the thin glass, the thin glass after production is re-heated to a temperature, which corresponds to $T_G+20$ K, and thereafter cooled with a cooling rate of 2 K/h to a temperature of 20° C. Thereafter the refractive index is re-measured (=theoretical refractive index) and the difference to the refractive index before this re-cooling determined.

The thin glass of the invention is preferably free of crystals. For the determination of the crystal-free status an optically polished probe is examined light microscopically with a one-sided edge lighting and a magnification of 40. The probes according to the invention contain particularly on a test surface of 4 cm² no crystals which are bigger than 50 μm, particularly no crystals which are bigger than 20 μm, preferably no crystals which are bigger than 5 μm and particularly preferably no crystals which are bigger than 1 μm. With "size" the Martin diameter is meant. However, the glass of the invention can contain smaller crystals, which could form due to the length of stay of the glass above the lower devitrification limit. These crystals, however, are very small, since the time at temperatures above the lower devitrification limit indeed made the formation of crystals possible, the crystal growth, however, due to the temperature profile and the strong dependence of the viscosity of the glass on the temperature was rapidly interrupted again. Therefore the thin glasses exhibit a very good inner quality. In particular the thin glasses preferably exhibit no so-called "central streak" as it is characteristic in Overflow Fusion- and New Down Draw-processes.

The thin glass of this invention has been cooled in comparison with conventional optical glasses comparatively fast, in order that the cooling track in the redrawing device has not to exceed a certain length. This is accompanied by a high fictive temperature in comparison with conventional optical glasses. A high fictive temperature results in a thermal shrinkage at re-cooling. The glass due to its cooling history exhibits a refractive index, which at re-cooling from a temperature $T_G+20$K to a temperature of 20° C. with a constant cooling rate of 2 K/h increases by a value of preferably at least 0.001, in particular of at least 0.004, preferably of at least 0.008. In alternative embodiments, the refractive index is increased after cooling by at least 0.02, more preferably by at least 0.05 and particularly preferably by at least 0.01. Thereby the glass exhibits compared to a slowly cooled bar a high thermal shrinkage. It became apparent, that the variance of the thermal shrinkage between several thin glasses is smaller, when the thermal shrinkage is large. In other words the mean deviation from the expected thermal shrinkage is smaller than at more slowly cooled glasses.

It is an advantage of this invention that it makes available thin glasses, which have an extraordinary surface quality. In particular the surface quality is noticeable in a roughness $R_a$ of at most 20 nm. The roughness depth is determined accordingly with DIN EN ISO 4287.

The thin glass exhibits preferably a density of more than 2.6 g/cm³, in particular more than 2.85 g/cm³, preferably more 3 g/cm³. Particularly preferably the density of the thin glass at least 3.2 g/cm³, more preferably at least 4 g/cm³, more preferably at least 5 g/cm³ and particularly preferably at least 6 g/cm³. Since preform and thin glass consist of the same glass, these values hold also for the glass of the preform accordingly. The density of the glass, however, should also not be too high, since the controlled drawing of the preform at a too high mass of the glass could become difficult. Therefore, the density is limited in particular to at most 8 g/cm³, in particular to at most 7 g/cm³.

The glass preferably exhibits a liquidus viscosity of less than $10^3$ dPas, in particular of less than $10^{2.5}$ dPas or even less than $10^2$ dPas. Glasses with this property are suited for this method, since glasses with a crystallization tendency, at which the crystallization region strongly is shifted to the low-viscose region, a process window near UEG is opened in the high viscose region. Up to now such glasses were regarded as not drawable.

The thin glass preferably shows a mean coefficient of linear thermal expansion (Coefficient of Thermal Expansion, CTE) of more than $\alpha_{+20/+300° C.}=7*10^{-6}$ K$^{-1}$. Preferably the CTE of the thin glass is more than $\alpha_{+20/+300° C.}=8.2*10^{-6}$ K$^{-1}$, more preferably at least $\alpha_{+20/+300° C.}=9*10^{-6}$ K$^{-1}$, more preferably at least $\alpha+_{+20/+300° C.}=10*10^{-6}$ K$^{-1}$ and particularly preferably at least $\alpha_{+20/+300° C.}=11*10^{-6}$ K$^{-1}$. Since preform and thin glass consist of the same glass, these values hold also for the glass of the preform accordingly.

The thin glass preferably shows a ratio of its width b to its thickness d of at most 200,000 to 1 and at least 20:1. The thin glass of this invention in particular can be available rolled. That means, that the glass is rolled up as a thin glass sheet. Thereby the thin glass preferably has a thickness d of less than 2 mm, in particular of less than 1 mm, more preferably of less than 0.5 mm, in particular of less than 0.2 mm and particularly preferably of less than 0.1 mm. Preferably the thin glass exhibits a length l of at least 5 m, more preferably of at least 10 m and particularly preferably of at least 20 m.

Alternatively the thin glass can be available in form of a circular wafer, for example 6-inch- or 12-inch or in form of a sheet. The width b of the glass preferably is more than 100 mm, more preferably more than 200 mm, more preferably at least 300 mm and particularly preferably at least 400 mm. In certain embodiments the width b of the thin glass is limited to less than 200 mm.

By means of the method of the invention thin glass components can be produced, which exhibits a thickness d of less than 2000 µm, less than 1000 µm, less than 500 µm, less than 100 µm, preferably less than 50 µm, particularly preferably less than 40 µm, less than 30 µm, less than 20 µm, less than 10 µm, wherein preferably at least one surface of the thin glass component at least partly exhibits a fire-polished surface quality. Hereby is meant with "thickness" in particular the mean thickness in the middle of the thin glass. With the "width" preferably is meant the mean width of the net sheet, in particular without consideration of edges in the border area or without consideration of the border area. The net sheet preferably comprises the thin glass in its horizontal extent insofar as it has a thickness, that at most 10 µm or at most 20 µm is larger as the thickness in the middle of the thin glass. Thus, the thicker border areas, respectively, edges are not included in the net sheet.

A fire-polished surface is to be understood as a glass surface resulting from a hot forming process, which glass surface has been formed without a contact of the glass melt with a contaminant as for example a press mold or a roll. Fire-polished surfaces are generally characterized by a very small roughness depth, which is not reached with conventional mechanical post processing. Further fire-polished surfaces could exhibit by vaporization of glass components as for example $B_2O_3$ or alkalis a slightly changed chemical composition compared to the bulk material. In particular fire-polished surfaces do not exhibit the grinding- or polishing marks typical for a mechanical cold finishing operation. A fire-polished glass surface therefore can be clearly distinguished from a mechanically polished surface by means of respective analytics.

The thin glass component preferably can be formed ribbon-shaped with two surfaces and a circumferential edge, wherein at least one surface of the thin glass component exhibits at least in sections a fire polished surface quality with an $R_a \leq 20$ nm.

Thereby the thin glass component can exhibit a width-thickness-ratio b/d of at most 200,000:1, preferably at most 20,000:1 and particularly preferably at most 200:1. Preferably the width b of the thin glass component is substantially larger than its thickness d. It is particularly preferred, when the width-thickness-ratio is at least 2:1, more preferably at least 20:1 and particularly preferably at least 100:1. The thin glass components of the invention can exhibit a very high surface quality, which particularly preferably, at least partially, is of fire-polished quality.

The thin glasses of the invention are characterized by excellent geometrical properties, in particular in the net region. Particularly included is a thickness tolerance of less than 60 µm, preferably less than 50 µm, more preferably less than 40 µm, in particular less than 30 µm, particularly preferably less than 20 µm or even less than 10 µm. Particularly included is also a total thickness variation (Total Thickness Variation, TTV after SEMI MF 1530) of less than 35 µm, preferably of less than 30 µm, more preferably of less than 25 µm, particularly preferably of less than 15 µm and particularly preferably of less than 7 µm. The TTV is the difference of the thicknesses of the thin glass component at its thickest and thinnest location, preferably in the net region (thus without border area/edges). Included in the extraordinary geometrical properties in particular also a warp after DIN 50441-5 of less than 4000 µm, preferably of less than 2000 µm, more preferably of less than 1500 µm and particularly preferably of less than 300 µm or even of less than 200 µm. These specifications hold in particular for an area of 200 mm×200 mm. The thin glasses of this invention preferably show a slope (TTV per 25.4 mm) of less than 40 µm, preferably of less than 35 µm, in particular less than 25 µm, more preferably of less than 20 µm, more preferably of less than 10 µm or less than 5 µm.

The thin glass produced with the method according to the invention is suited for use in various optical applications as for example as display glass (for example in OLED, LCD 2D or 3D displays); in the field lighting (for example OLED), Wafer-Level-Optics and/or as filter glass.

Example 1

In a melting end for the production of optical glasses bars are produced from a glass with a refractive index $n_D$ of 1.80 and a CTE of 10 ppm/K. This glass exhibits above 640° C. a crystallization velocity of >0.01 µm/min. The bars exhibit a width of 160 mm and a thickness of 14 mm. From the endless bar single pieces with a length of 1 m are made. These are processed by means of grinding and polishing processes, so that a rectangular block preform is produced with the dimensions 1000×160×8 mm³.

This preform is inserted in a redrawing device and the temperature profile adjusted in such a way, that a viscosity profile according to FIG. 9 results. The glass exhibits for a time span of 2 minutes a temperature above its lower devitrification limit. The glass shows a mean decrease of the viscosity at increasing temperature in a viscosity range from $10^8$ to $10^5$ dPas of $10*10^5$ dPas/K.

The preform is introduced into the furnace with a velocity of 30 mm/min and the piece is drawn with a velocity of 810 mm/min. A glass sheet is formed with a width of 100 mm and a net width of 50 mm. In the net region the sheet exhibits a thickness of about 0.3 mm. The surfaces are fire-polished.

Probes are investigated for crystals. They do not exhibit crystals.

Example 2

From glass bars of a glass with a mean decrease of the viscosity at increasing temperature in the range from $10^8$ to $10^5$ dPas of $3.2*10^5$ dPas/K and a CTE of 3.25 ppm/K preforms are produced with the dimension 100×50×2 mm³ by means of grinding and polishing. These are mounted in a device, so that they are driven in a pre-heating furnace with a velocity of 1 mm/s and subsequently pass a laser line of a $CO_2$-laser. The laser line is produced with a scanner. The beam diameter is set to 2 mm at the position of the glass. The glass heated in a linear manner line is drawn via the gravity. The viscosity profile can be extracted from FIG. 10. The glass exhibits for a time span of 3 seconds a temperature above its lower devitrification limit. A sheet is produced with a gross width of 40 mm and a thickness from 0.05 mm to 1 mm. The sheet obtained in this way exhibits a fire-polished surface a no crystals larger than 50 µm.

DETAILED DESCRIPTION

In the following detailed description of preferred embodiments for clarity reasons same reference signs denote essentially same parts in or on these embodiments.

Figure 1:
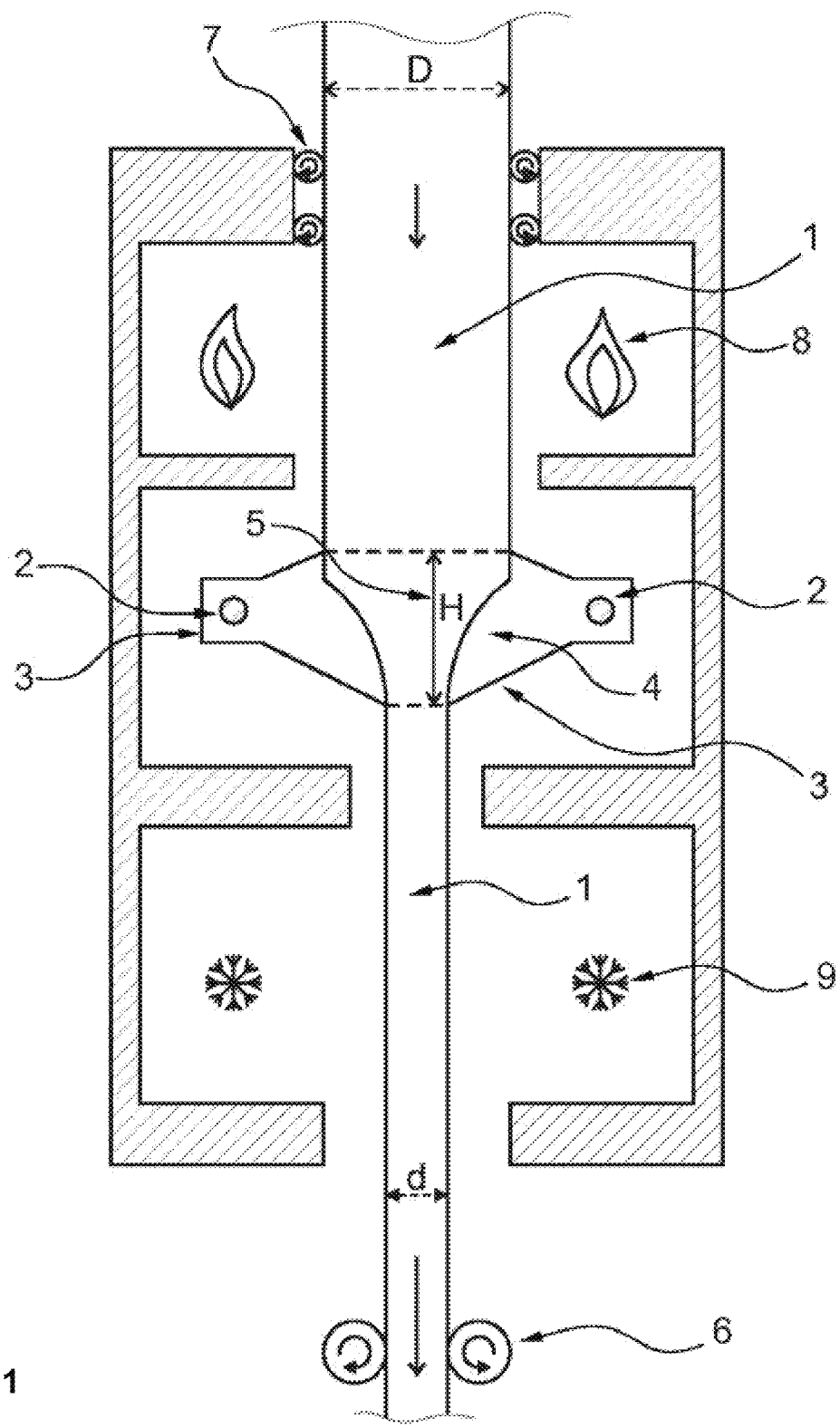
FIG. 1 schematically shows the setup of an exemplary embodiment of the invention of a redrawing device in a side view, FIG. 2 schematically shows a preform, FIG. 3 schematically shows the setup with a laser, FIG. 4 schematically shows the mode of operation of a possible radiant heater as heating facility.

FIG. 1 shows the schematic setup of an exemplary embodiment of the invention of a redrawing device in a side view. In the redrawing device a preform 1 is moved from top to bottom through the device. The redrawing device exhibits two heating facility 2, which are placed in a middle region of the device. In this embodiment the heating facilities are shadowed with blinds 3 in such a way, that a deformation region 4 is generated. A section of the preform 1, which is inside the deformation region 4, is heated in such a way, that it reaches the temperature $T_2$. Also the deformation zone 5 with the height H is shown. The preform 1 is drawn down by a drawing facility 6, which is realized here in form of two driven rolls. Due to the fact, that the feeding facility 7, here also realized in form of rolls, pushes the preform 1 slower that the drawing facility 6 draws, the preform 1 deforms in the deformation region 4. The preform 1 therewith becomes thinner, the thickness after deformation d is smaller than that thickness before the deformation D.

Before the preform 1 is led in the deformation region 4, it is pre-heated to the temperature $T_1$ by means of a pre-heating facility 8, symbolized here by a burner flame. After passing the deformation region 4 the preform 1 is led in a cooling facility 9, which is symbolized here by an ice crystal.

Figure 2:
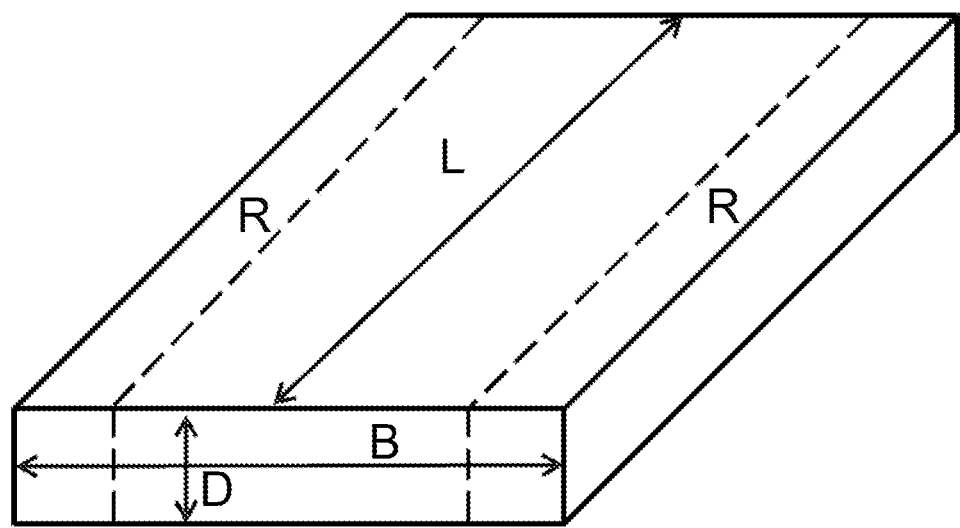

FIG. 2 shows schematically a preform with a length L, a thickness D and a width B. Also the border areas R are shown, which extend from the border of the preform in direction of the middle. Preferably the border areas R take up a part of at least 1% and at most 50% of the width of the preform, so that to each border area accounts for at least 0.5% and at most 25% of the width of the preform. Particularly the border areas R extent over a part of at least 2% and at most 30%, preferably at least 5% at most 20% and particularly preferably at least 7% at most 15% of the width of the preform. In the border areas the temperature is during the pre-heating preferably higher than in the middle of the preform, in particular at least 5° C. or at least 20° C. higher.

Figure 3:
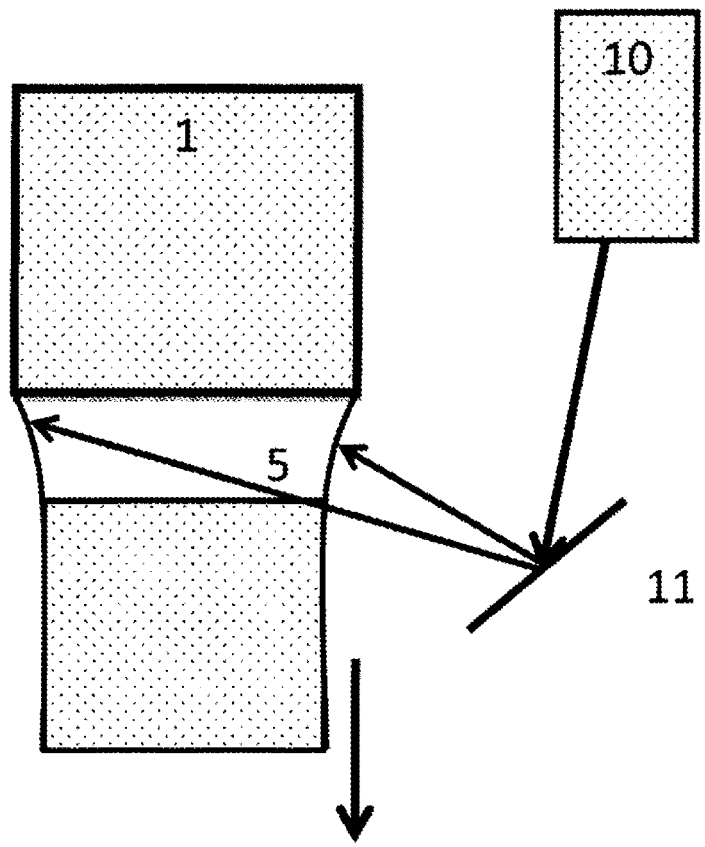

FIG. 3 shows schematically the setup of a heating facility with a laser 10. The beam of the laser is guided on the glass by means of a scanning mirror 11. By means of the movement of the scanning mirror the deformation zone is heated equally. Not shown is an optional beam-shaping optics.

Figure 4:
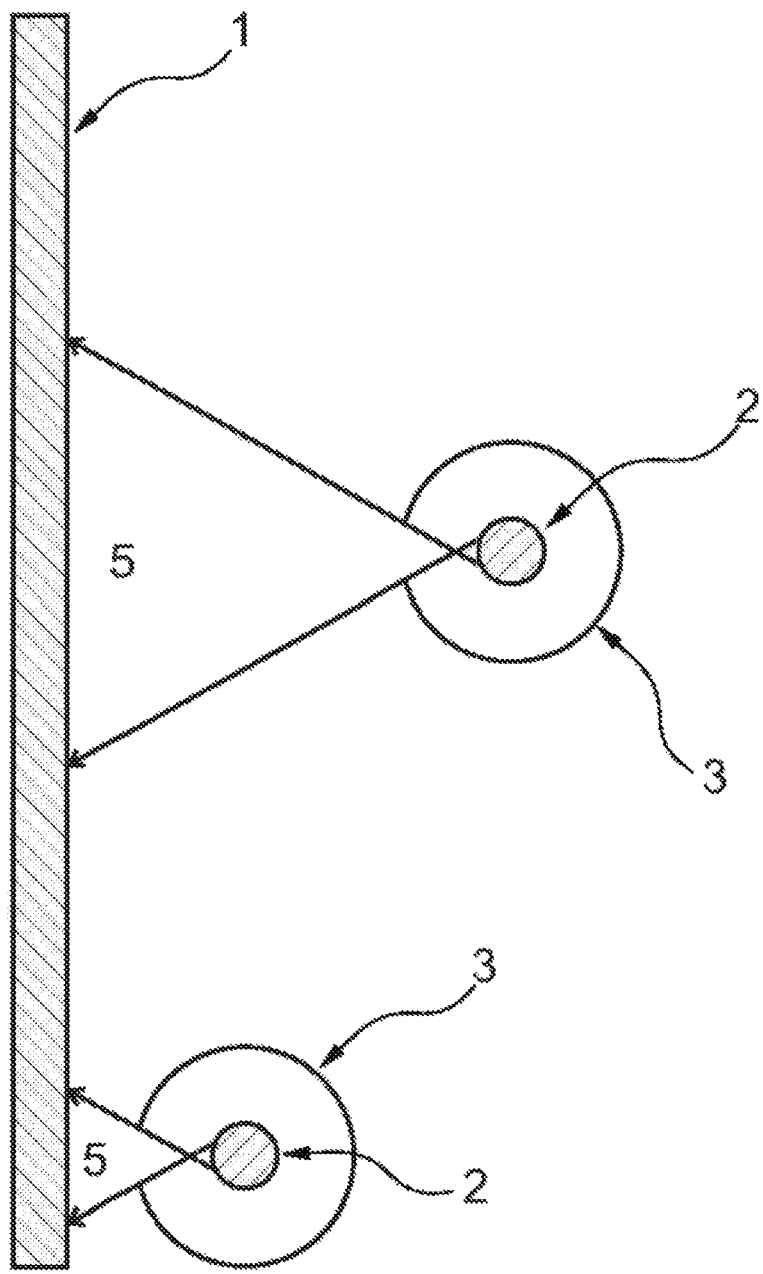

FIG. 4 shows schematically the mode of operation of a possible radiant heater, which could be applied as heating facility 2. Depending on its distance to the preform 1 the height of the deformation zone 5 is different. In the figure also is shown, how by means of shadowing, respectively, a blind 3 the deformation zone 5 can be limited, to obtain a deformation zone 5 as low as possible. Thus, both the distance and the design of the heating facility can serve to the adjustment of the height of the deformation zone 5.

Figure 5:
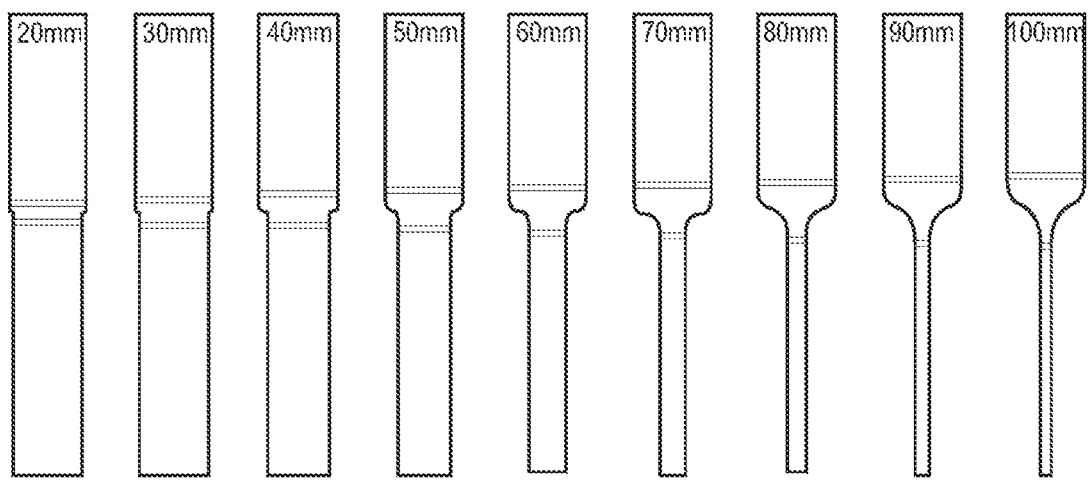
FIG. 5 shows the influence of the height of the deformation zone during the redrawing.

FIG. 5 shows, how the widths of a glass product depend on the height of the deformation zone during the redrawing. It is recognizable, that a low deformation zone has the effect, that the decrease of the width of the preform is reduced.

Figure 6:
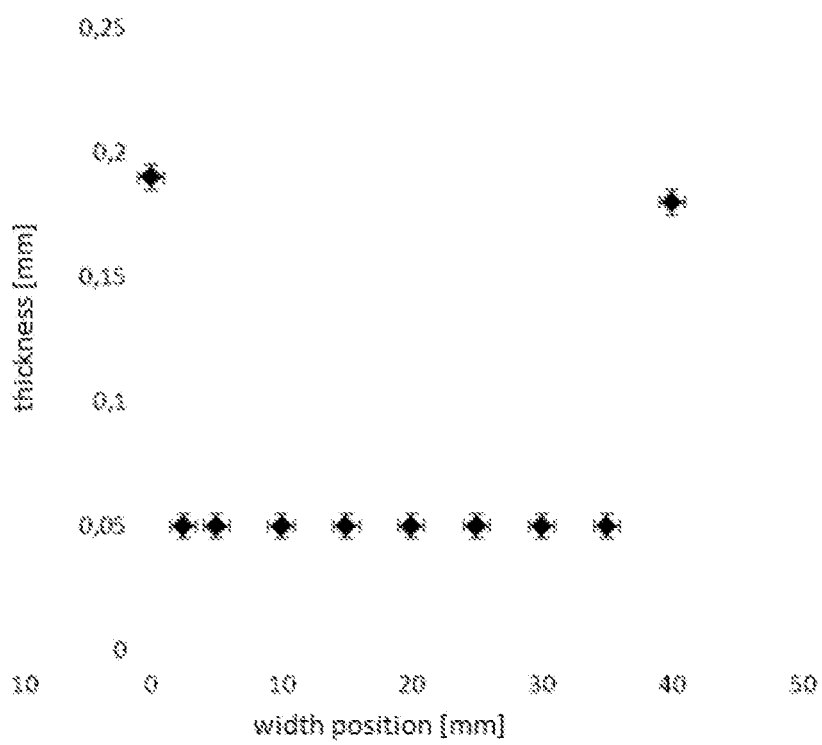
FIG. 6 shows a possible thickness distribution.

FIG. 6 shows, how the thickness d of a flat glass product is distributed over the width b of the product. It can be perceived, that the edges at the border area of the glass product are relatively narrow. The part, which exhibits a homogeneous low thickness, can be used for the application of the glass product, the edge generally has to be removed. With the method according to the invention, the yield is especially high.

Figure 7:
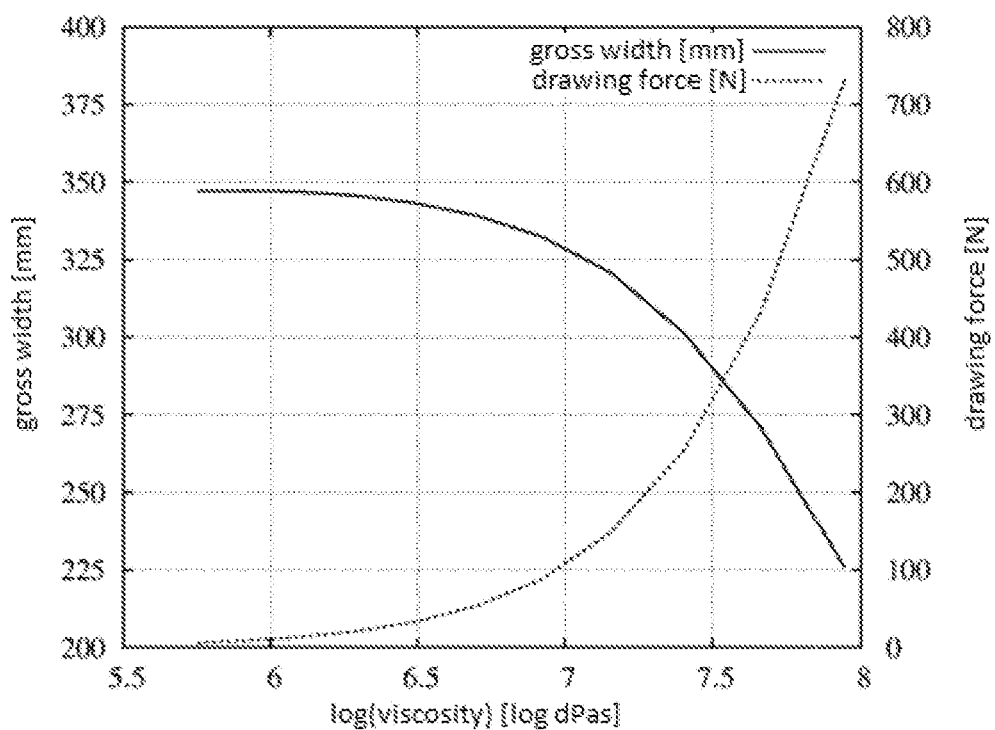
FIG. 7 shows an exemplary mean width b (gross width) of a redrawn thin glass component as well as the necessary drawing force each in dependence on the viscosity of the glass of the preform.

FIG. 7 shows exemplary the mean width b (gross width) of the redrawn thin glass component and the drawing force needed for the drawing each in dependence on the viscosity of the glass of the preform in the deformation zone for the case of a 4 mm thick and 400 mm wide preform, which is pulled into a 40 mm high muffle with 5 mm/min. The glass is pulled of with 200 mm/min. It is clearly recognizable, that the drawing force needed grows increasingly which increasing viscosity. Furthermore it is apparent, that the mean width b of the product obtained decreases increasingly with increasing viscosity.

Figure 8:
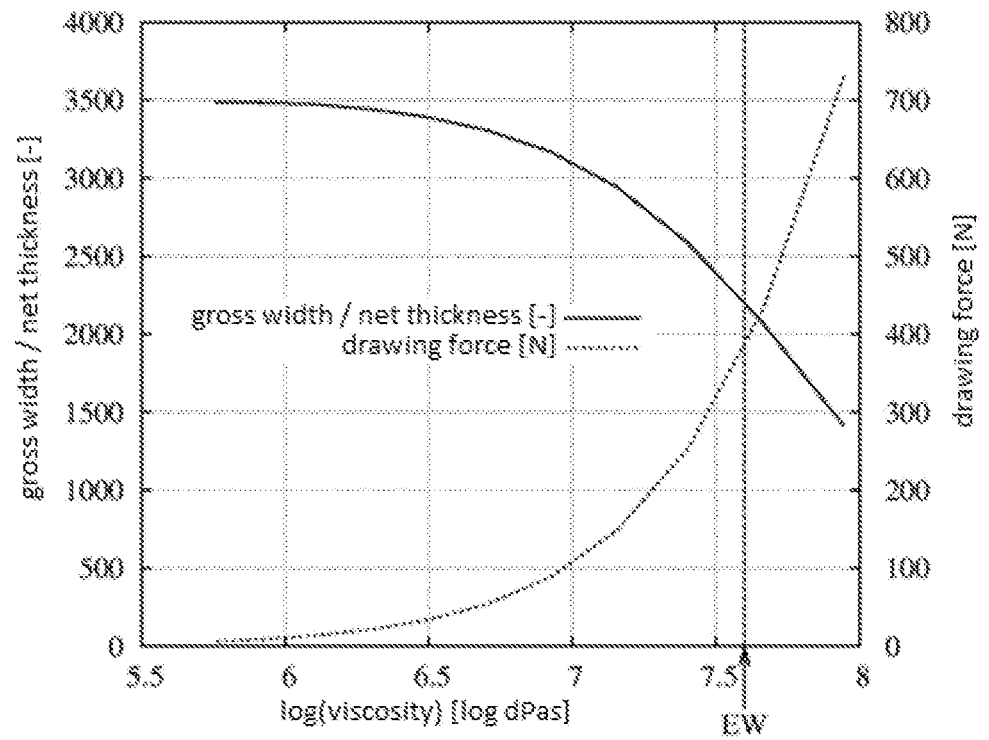
FIG. 8 shows an exemplary ratio of the mean width b (gross width) to the mean thickness d (net thickness) of the redrawn thin glass component as well as the necessary drawing force each in dependence on the viscosity of the glass of the preform in the deformation zone.
Figure 9:
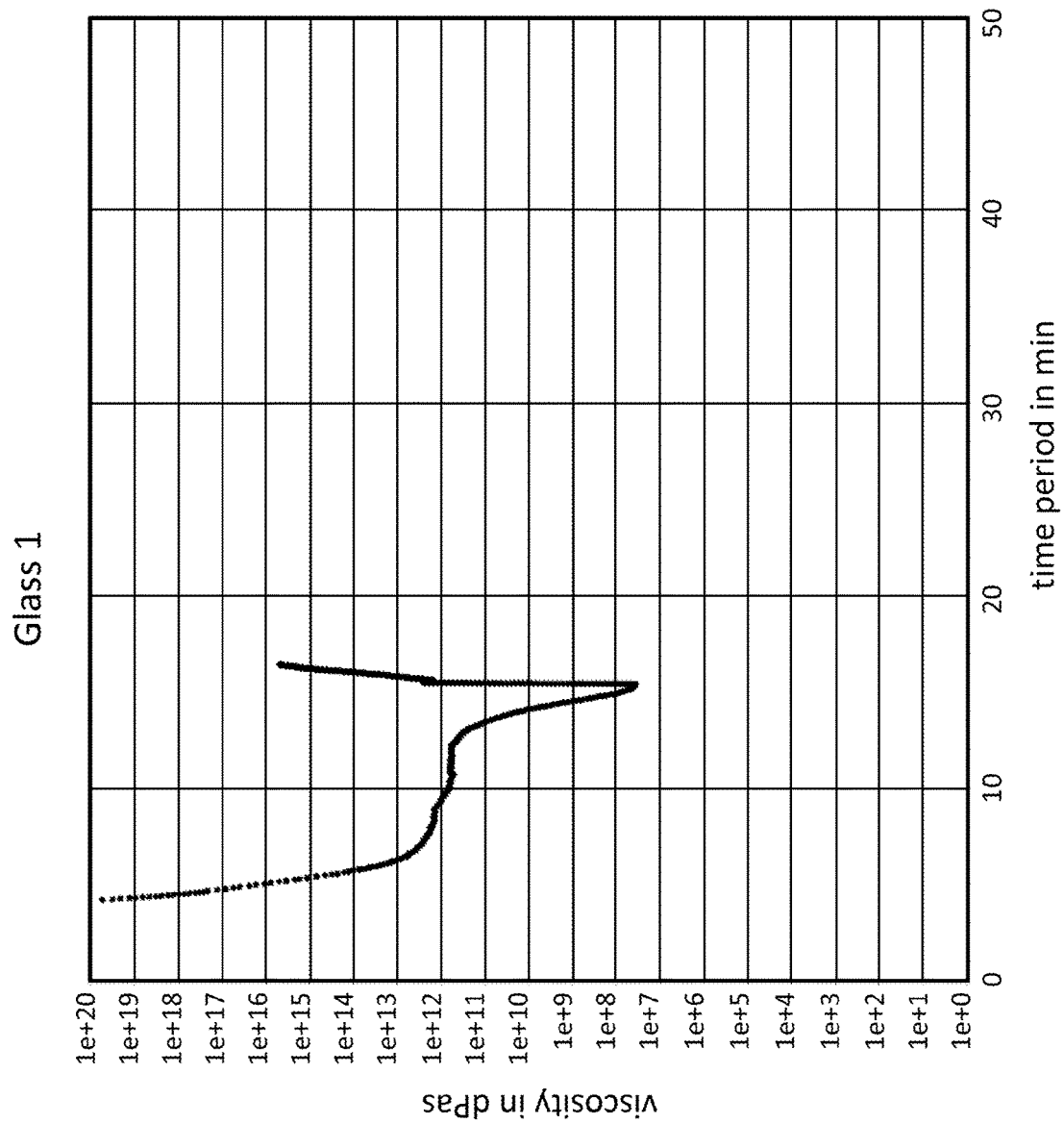
FIG. 9 shows the viscosity profile during redrawing after example 1.
Figure 10:
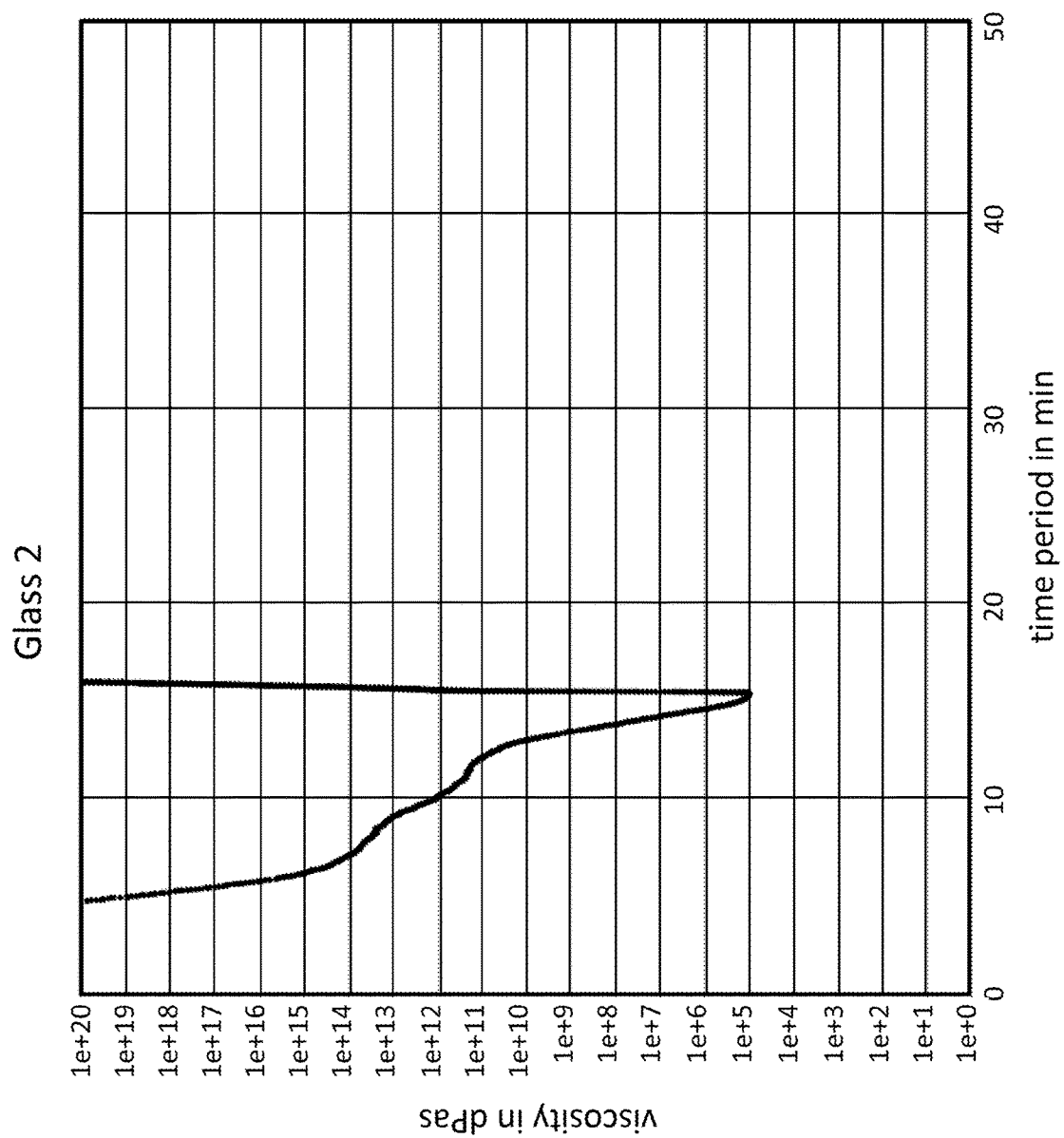
FIG. 10 shows the viscosity profile during redrawing after example 2.

FIG. 8 shows exemplary the ratio of the mean width b (gross width) to the mean thickness d (net width) of the drawn glass component and the drawing force needed for the pulling out each in dependence on the viscosity of the glass of the preform in the deformation zone for the case of a 4 mm thick and 400 mm wide preform, which is pulled into a 40 mm high muffle with 5 mm/min. The glass is pulled off with 200 mm/min. It is apparent, that the width-thickness-ratio b/d of the product obtained decreases increasingly with increasing viscosity. Compared to the decrease of the mean width b with increasing viscosity shown in FIG. 6 the ratio b/d decreases relatively still more strongly with increasing viscosity.

LIST OF THE REFERENCE SIGNS

1 Preform
2 Heating facility
3 Blind
4 Deformation region
5 Deformation zone
6 Drawing facility
7 Feeding facility
8 Pre-heating facility
9 Cooling facility
10 Laser
11 Scanning mirror

What is claimed is:

1. A thin glass comprising a refractive index of at least 1.68, an average thickness (d) of less than 2 mm, and a liquidus viscosity of less than $10^3$ dPas, wherein the refractive index is at least 0.001 smaller than a theoretical refractive index.

2. The thin glass of claim 1, wherein the liquidus viscosity is less than $10^{2.5}$ dPas.

3. The thin glass of claim 1, wherein the thin glass further comprises at least one fire-polished surface having a roughness $R_a$ of at most 20 nm.

4. The thin glass of claim 1, wherein the thin glass has a density of more than 2.6 g/cm$^3$.

5. The thin glass of claim 4, wherein the density is more than 2.85 g/cm$^3$.

6. The thin glass of claim 1, wherein the thin glass has a mean coefficient of linear thermal expansion $\alpha_{+20/+300° C.}$ of more than $7*10^{-6}$ K$^{-1}$.

7. The thin glass of claim 6, wherein the mean coefficient of linear thermal expansion $\alpha_{+20/+300° C.}$ is more than $8.2*10^{-6}$ K$^{-1}$.

8. The thin glass of claim 1, wherein the thin glass has a warp of less than 1500 μm.

9. The thin glass of claim 8, wherein the warp is less than 300 μm.

10. The thin glass of claim 1, wherein the thin glass is configured for a use selected from the group consisting of an OLED display glass, a LCD 2D display glass, a LCD 3D display glass, a lighting device, an OLED, a wafer-level-optic device, and a filter glass.

11. A method for the production of the thin glass of claim 1, comprising the steps of:
   providing a vitreous preform with an average width (B), an average thickness (D), and a refractive index of at least 1.68 in a redrawing device;
   heating at least a part of the preform; and
   redrawing the preform to the thin glass, with an average width (b) and the average thickness (d),
   wherein the heated part of the preform exhibits, for a duration of at most 30 minutes, a temperature above a lower limit of devitrification of the glass,
   wherein the preform comprises glass that has a viscosity dependent on temperature, the dependence having a mean decrease of viscosity with increasing temperature in a viscosity range of $10^8$ to $10^5$ dPas of at least $3*10^5$ dPas/K, and
   wherein the heating step comprises heating to a temperature ($T_2$) at which the glass of the preform exhibits a viscosity of at least $10^4$ dPas and at most $10^8$ dPas.

12. The method of claim 11, wherein the dependence is a mean decrease of the viscosity in a viscosity range of $10^8$ to $10^5$ dPas of at least $5*10^5$ dPas/K.

13. The method of claim 11, wherein the duration is at least 3 seconds.

14. The method of claim 11, wherein the duration is at least 30 seconds.

15. The method of claim 11, wherein the duration is at most 15 minutes.

16. The method of claim 11, wherein the duration is at most 6 minutes.

17. The method of claim 11, further comprising the step of cooling the glass of the preform from a temperature that corresponds to a viscosity of $10^{12}$ dPas to a temperature that corresponds to a viscosity of $10^{13}$ dPas at a mean cooling rate of at most 1000 K/min.

18. The method of claim 17, wherein the mean cooling rate is at most to 500 K/min.

19. The method of claim 11, wherein the glass of the preform, before the heating step, is preheated at least partially, to a temperature ($T_1$) where the glass exhibits a viscosity of $10^{10}$ to $10^{14}$ dPas.

20. The method of claim 19, wherein, during the preheating step, the temperature is higher in border areas of the preform than in a middle of the preform.

21. A thin glass comprising a refractive index of at least 1.68, an average thickness (d) of less than 2 mm, and a liquidus viscosity of less than $10^3$ dPas, wherein the thin glass has a warp of less than 1500 μm.

* * * * *